(12) United States Patent
Chen et al.

(10) Patent No.: US 6,560,080 B1
(45) Date of Patent: May 6, 2003

(54) LOW-VOLTAGE TRIGGERED ESD PROTECTION CIRCUIT

(75) Inventors: Wei-Fan Chen, Taichung (TW); Ta-Lee Yu, Hsinchu Hsien (TW)

(73) Assignee: Winbond Electronics Corp., Hsinchu (TW)

(*) Notice: Subject to any disclaimer, the term of this patent is extended or adjusted under 35 U.S.C. 154(b) by 182 days.

(21) Appl. No.: 09/596,148

(22) Filed: Jun. 16, 2000

(30) Foreign Application Priority Data

Nov. 29, 1999 (TW) ........................................ 88120763 A

(51) Int. Cl.$^7$ ................................................ H02H 9/00
(52) U.S. Cl. ................................ 361/56; 361/111
(58) Field of Search ....................... 257/355; 361/111, 361/56

(56) References Cited

U.S. PATENT DOCUMENTS

| | | | | |
|---|---|---|---|---|
| 5,400,202 A | * | 3/1995 | Metz et al. | 361/56 |
| 5,869,873 A | * | 2/1999 | Yu | 257/362 |
| 5,909,347 A | * | 6/1999 | Yu | 361/56 |
| 5,932,916 A | * | 8/1999 | Jung | 257/355 |
| 5,945,714 A | * | 8/1999 | Yu | 257/355 |
| 6,008,508 A | * | 12/1999 | Berhemont et al. | 257/175 |

\* cited by examiner

*Primary Examiner*—Brian Sircus
*Assistant Examiner*—Zeev Kitov
(74) *Attorney, Agent, or Firm*—Ladas & Parry

(57) ABSTRACT

The present invention provides an electrostatic discharge (ESD) protection circuit. The ESD protection circuit comprises a semiconductor-controlled-rectifier (SCR) and a non-volatile memory. The SCR comprises an anode, an anode gate and a cathode. The anode and the cathode are coupled to a first node and a second node, respectively. The non-volatile memory comprises a floating gate and two source/drains. The two source/drains are respectively coupled to the cathode and the anode gate. The floating gate is provided with a predetermined charge to decrease the trigger voltage of the SCR.

11 Claims, 5 Drawing Sheets

LOW-VOLTAGE TRIGGERED ESD PROTECTION CIRCUIT

BACKGROUND OF THE INVENTION

1. Field of the Invention

The present invention generally relates to an electrostatic discharge (ESD) protection circuit. More specifically, the present invention relates to an ESD protection circuit with a tunable trigger voltage.

2. Description of the Related Art

ESD protection is an important consideration in the sub-micron technology. FIG. 1 is a cross-section diagram of a lateral semiconductor-controlled-rectifier (LSCR) according to the prior art. Numeral 1 represents a core circuit powered by power sources VSS and VDD. Numeral 2 represents a pad. A lateral semiconductor-controlled-rectifier (LSCR) is connected to the pad 2. During an ESD event, ESD stress is released through the turn-on of the LSCR. Thus, the core circuit 1 is prevented from damage by ESD event.

Please refer to FIG. 1. An n-type well region 11 is formed in the p-type substrate 10. A p+ doped region 12 is formed inside the n-type well region as an anode of the LSCR 3. A n+ doped region 13 is formed inside the p-type substrate 10 as a cathode of the LSCR 3. The p+ doped region 13 is coupled to the n-type well region via an n+ contact region 14. The n+ doped region 13 is coupled to the p-type substrate 10 via a p+ contact region.

The LSCR 3 in FIG. 1 comprises two parasitic bipolar transistors, T1 and T2. As shown in the diagram, the p+ doped region 12, the n-type well region 11 and the p-type substrate 10 form the emitter, the base and the collector of a PnP bipolar transistor Tl, respectively. The n-type well region 11, the p-type substrate 10 and the n+ doped region form the emitter, the base and the collector of a npn bipolar transistor T2. The resistors Rwell and Rsub represent the spreading resistance of the n-type well 11 and the p-type substrate 10, respectively. As shown in FIG. 1, n+ contact region 14 and the p+ contact region 12 both connect to the pad 2. The n+ doped region 13 and the p+ contact region 15 both connect to the power source VSS. The power source VSS is usually grounded in normal operation without ESD event.

FIG. 2 is a diagram of I-V curves for an LSCR. During an ESD event, the power sources VDD and VSS are all disconnected and floating. When a positive pulse relative to the power source VSS happens at the pad 2, the LSCR 3, which has a trigger voltage Vtrig and a trigger current Itrig, turns on to release the ESD stress because of the avalanche breakdown between the n-type well region 11 and the p-type substrate 10. Then, the LSCR 3 clamps the voltage drop between the anode 12 and the cathode 13 in a holding voltage Vh to prevent the core circuit 1 from damage caused by ESD stress. When a negative pulse relative to the power source VSS happens at the pad 2, the junction between the n-type well region 11 and the p-type substrate 10 is forward biased to release the ESD stress and protect the core circuit 1. The I-V curve of the LSCR 3 is shown in FIG. 2. The trigger voltages Vtrig, the breakdown voltage between the n-type well 11 and the p-type substrate 10, is around 30 to 50 volt for 0.5 um technology.

FIG. 3 is a cross-section diagram of a field-oxide-edge-triggered SCR according to the prior art. FIG. 4 is a cross-section diagram of a gate-aided SCR according to the prior art. However, the trigger voltage of around 30 to 50 volt is too high and the core circuit would be damaged before the LSCR 3 is triggered. Thus, FIG. 3 shows an improvement of FIG. 1. As shown in FIG. 3, a field-oxide 20 and an n+ breakdown region 22 adjacent to the field-oxide 20 are added. Since the p-type substrate 10 under the field-oxide 20 has a higher doped concentration to form channel stoppers, the breakdown voltage of the junction between the n+ breakdown region 22 and the substrate at the edge of the field oxide will breakdown earlier to trigger the LSCR. FIG. 4 shows another improvement of the LSCR in FIG. 1. The breakdown voltage the source/drains and the substrate of a MOS transistor is lower than that between the n-type well 11 and the p-type substrate 10. The trigger voltages Vtrig of the LSCRs in FIG. 3 and FIG. 4 are around 15 to 20 volt.

However, based upon a fixed structure dimension and a given process technology, each of the ESD protection circuits mentioned has only a single ESD protection performance. For example, the SCRs suitable for 5-volt input/outputs (I/Os) may not suit 12-volt I/Os. Engineers must re-design the layout, test the ESD performance and spend much time and money to obtain two kinds of ESD protection circuits to meet different requirements.

SUMMARY OF THE INVENTION

Therefore, an object of the present invention is to provide an ESD protection. circuit with a non-volatile memory inside. By adjusting the charge in the floating gate of the non-volatile memory, different trigger voltages for different requirements can be achieved.

The present invention achieves the above-indicated objects by providing an electrostatic discharge (ESD) protection circuit. The ESD protection circuit comprises a semiconductor-controlled-rectifier (SCR) and a non-volatile memory. The SCR comprises an anode, an anode gate and a cathode. The anode and the cathode are coupled to a first node and a second node, respectively. The non-volatile memory comprises a floating gate and two source/drains. The two source/drains are respectively coupled to the cathode and the anode gate. The floating gate comprises a predetermined charge to decrease the trigger voltage of the SCR.

In view of structures, the present invention provides an electrostatic discharge protection circuit comprising an n-type semiconductor layer, a p-type semiconductor layer, a p-type doped region and a non-volatile memory. The n-type semiconductor layer comprises a first contact region coupled to a first node. The p-type semiconductor layer adjacent to the n-type semiconductor forms a junction therebetween and comprises a second contact region. The p-type doped region is positioned in the n-type semiconductor region and is coupled to the first node. The non-volatile memory is positioned in the p-type semiconductor layer and comprises a floating gate and two source/drains. One source/drain is coupled to the n-type semiconductor layer. Another source/drain and the second contact region are coupled to a second node. The floating gate comprises a predetermined charge to increase the leakage current in one of the two drain/sources during an ESD event.

If the voltage at the first node exceeds a predetermined voltage defined by the predetermined charge in the floating gate, gate-induced-drain-leakage occurs to lower the voltage of the n-type semiconductor layer near the junction. Furthermore, GIDL will flow through the p-type semiconductor layer to raise the voltage of the p-type semiconductor layer near the junction. Both the results can trigger the SCR to protect the core circuit.

Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1:
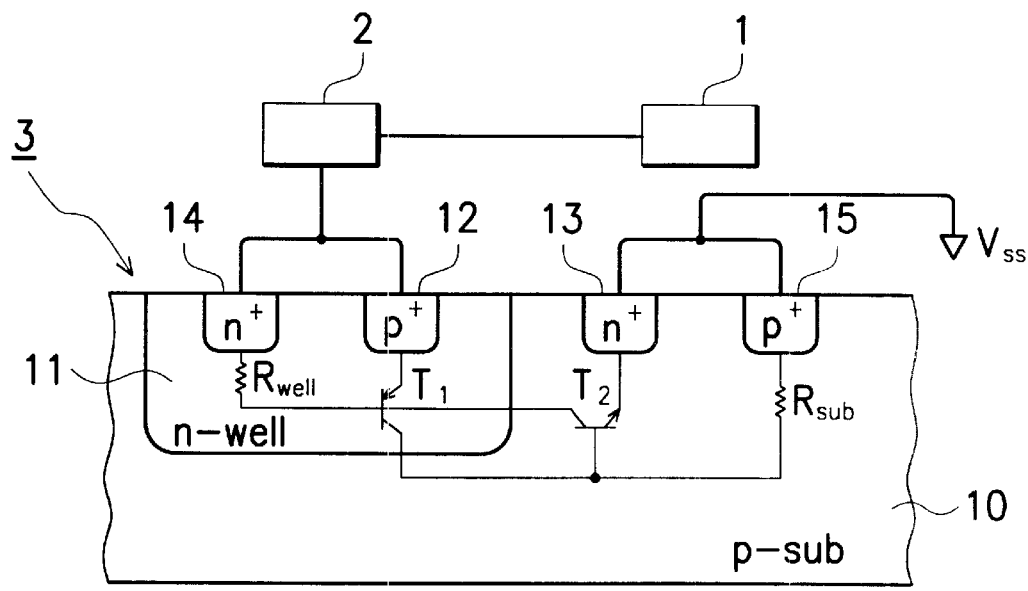
FIG. 1 is a cross-sectional diagram of a lateral semiconductor-controlled-rectifier (LSCR) according to the prior art.
Figure 2:
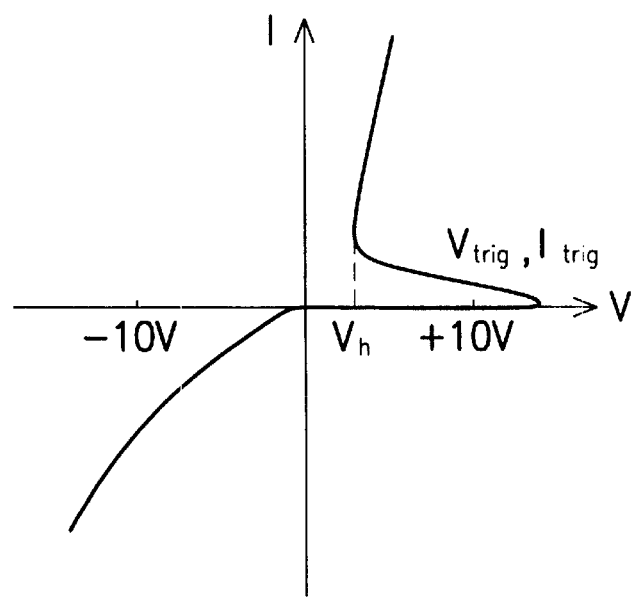
FIG. 2 is a diagram of I-V curves for an LSCR.
Figure 3:
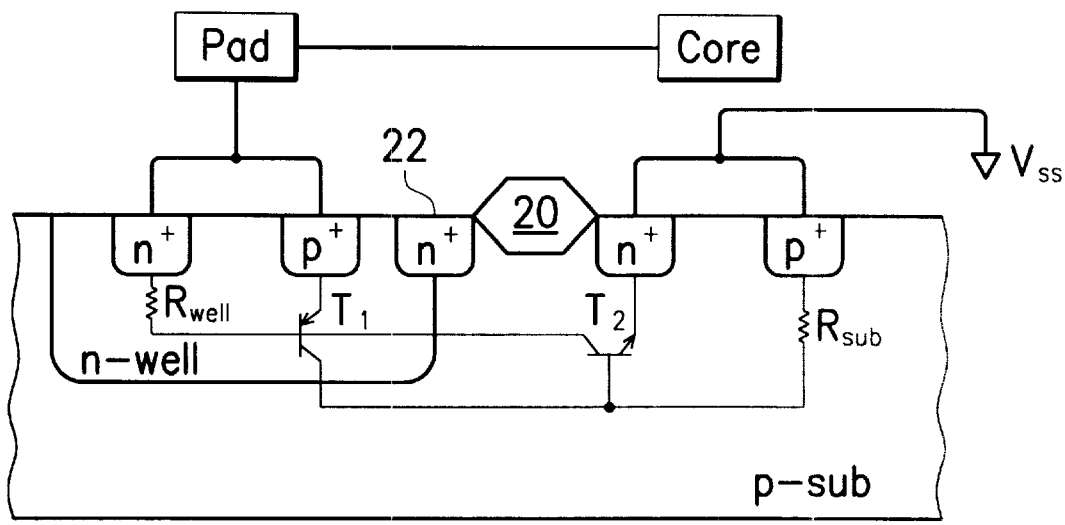
FIG. 3 is a cross-sectional diagram of a field-oxide-edge-triggered SCR according to the prior art.
Figure 4:
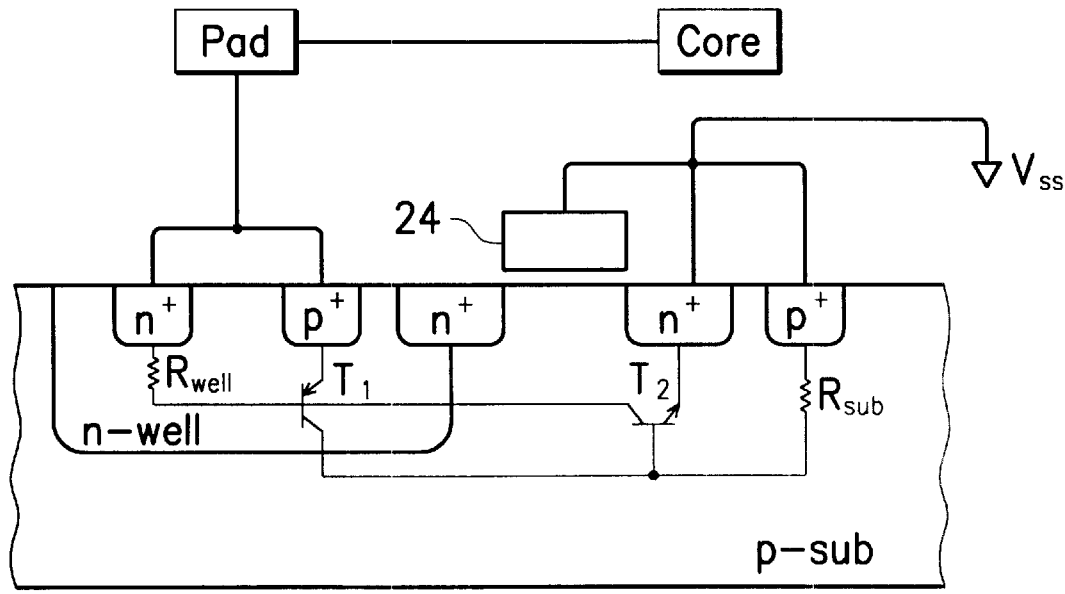
FIG. 4 shows another improvement of the LSCR in FIG. 1.
Figure 5:
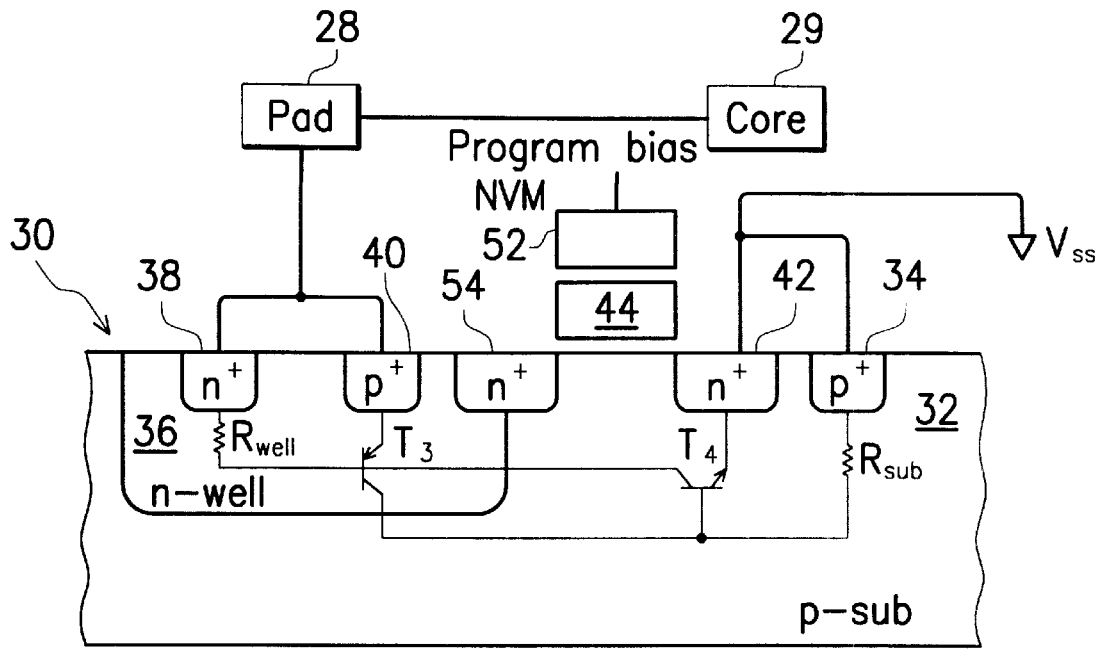
FIG. 5 is a cross-sectional diagram of an ESD protection circuit according to the present invention.
Figure 6:
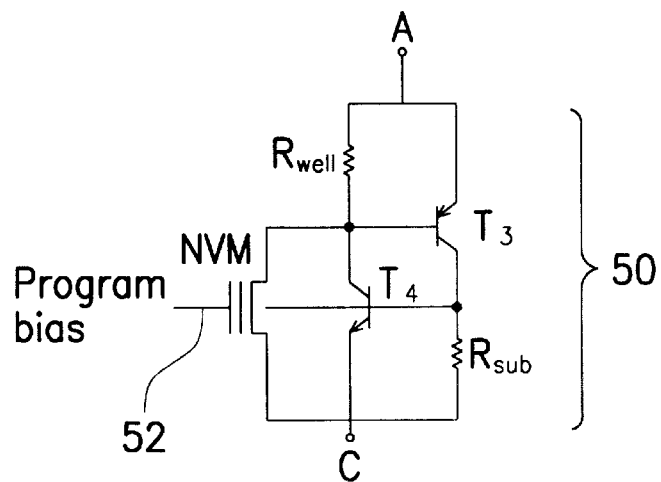
FIG. 6 is the equivalent schematic circuit of the ESD protection circuit in FIG. 5.

FIG. 5 is a cross-sectional diagram of an ESD protection circuit according to the present invention. FIG. 6 is the equivalent schematic circuit of the ESD protection circuit in FIG. 5. The present invention provides an ESD protection circuit comprising a non-volatile memory. Numeral 29 represents a core circuit of an integrated circuit (IC) powered by a power source VSS and a power source VDD during normal operation (without ESD event). Numeral 28 represents a pad. The pad connects to the ESD protection circuit 30 of the present invention to prevent the core circuit 29 from being damaged during an ESD event. According to the present invention, the ESD protection circuit 30 comprises a semiconductor-controlled-rectifier (SCR) 50 and a non-volatile memory.

The ESD protection circuit 30 is constructed on a semiconductor wafer. The semiconductor wafer comprises an n-type semiconductor region, such the n-well region 36 in FIG. 5. The n-well region 36 comprises an first contact region, such as the n+ contact region 38, to form a good electrical contact between the n-well region 36 and the succeeding metal line formed thereon (not shown). The ESD protection circuit 30 further comprises a p-type semiconductor layer, such as the p-substrate region 32 in FIG. 5. The p-substrate region 32 is adjacent to the n-well region 36 to form a junction therebetween. The p-substrate region 32 comprises a second contact region, such as the p+ contact region 34 in the surface of the p-substrate region 32, to form a good electrical contact between the p-substrate region 32 and the succeeding metal line formed thereon (not shown).

A p-type doped region 40 positioned in the n-well region 36 and the n+ contact region 38 are both coupled to a first node (the Pad 28). An n-type doped region 42 positioned in the p-substrate region 32 and the p+ contact region 34 are both coupled to a second node (the power source VSS). Thus, the p+ contact region 40, the n-type doped region 42, the n-well region 36 and the p-substrate region 32 respectively form the anode, the cathode, the anode gate and the cathode gate of the SCR 50.

The ESD protection circuit 30 further comprises a non-volatile memory 52 positioned on the surface of the p-substrate 32. The non-volatile memory 52 comprises a floating gate 44 and two source/drains. One source/drain is coupled to the n-well region 36, such as the first source/drain region 54 on the junction in FIG. 5. Another source/drain and the second contact region are coupled to the second node. As shown in FIG. 5, another source/drain is presented by the n-type doped region 42. The floating gate 44 has a predetermined charge to decrease the trigger voltage of the SCR 50.

As shown in FIG. 6, the SCR 50 has two bipolar transistors, T3 and T4. The p-type doped region 40, the n-well region 36 and the p-substrate 32 form the emitter, the base and the collector of a pnp bipolar transistor T3, respectively. The n-well region 36, the p-substrate 32 and the n-type doped region 42 form the emitter, the base and the collector of a npn bipolar transistor T4. The resistor Rwell and Rsub represent the spreading resistance of the n-well region 36 and the p-substrate region 32, respectively. The two source/drains of the non-volatile memory 52 are respectively coupled to the base of the transistor T3 and the emitter of the transistor T4. Furthermore, the substrate of the non-volatile memory 52 is coupled to the base of the transistor T4.

Figure 7:
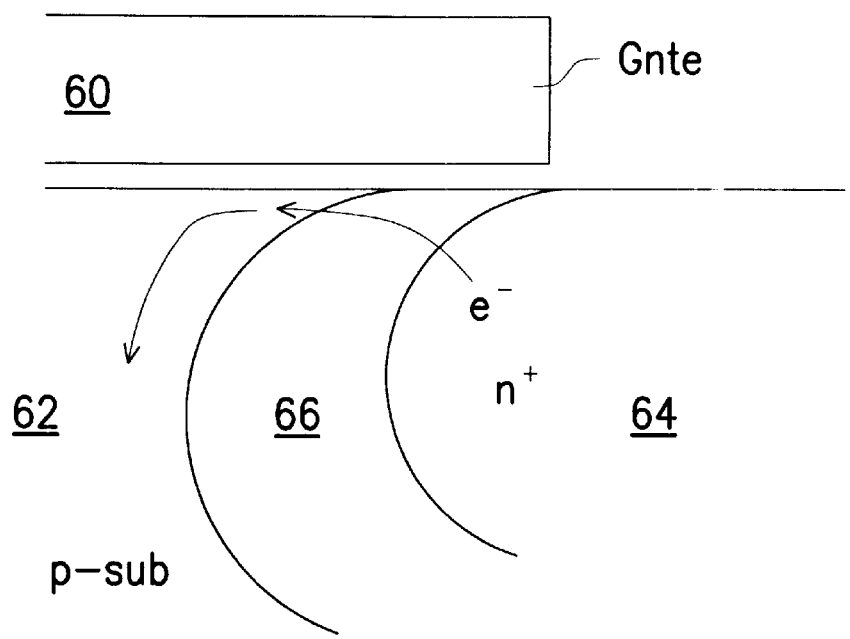
FIG. 7 is a diagram illustrating the occurrence of GIDL current.

The FIG. 7 is a diagram of the occurrence of GIDL current. Gate-induced-drain-leakage is well-known in semiconductor device physics. As the voltage of the gate 60 decreases, the p-substrate 62 under the gate 60 will extend to the surface of the source/drain 60, and the minimum space of the deplete region becomes narrower. If the minimum space reaches a critical value, tunneling effect according to quantum mechanics makes the electrons and the holes jump across the potential barrier between the p-substrate and the source/drain 60 and forms a current (GIDL current). Thus, applying this theory, one can control the quantity of the charge in the floating gate 44 of the non-volatile memory 44 to control the amount of the GIDL current.

If a positive ESD stress relative to the power source VSS occurs at the Pad 28, the current flows sequentially through the n+ contact region 38, the n-well region 36, the first source/drain region 54, the p-substrate region 32 and the p+ contact region 34, and finally reaches the power source VSS. The current from the first source/drain region 54 to the p-substrate region 32 is the GIDL current. As the ESD stress increases at the Pad 28, the SCR 50 will be turned on to release the ESD stress and protect the core circuit 29.

Figure 8:
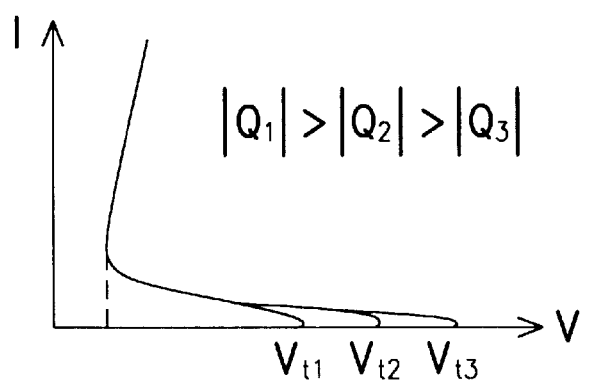
FIG. 8 is a diagram of the IV curves of the ESD protection circuit in FIG. 5.

FIG. 8 is the IV curves of the ESD protection circuit in FIG. 5. The trigger voltage of the SCR depends upon the amount of the GIDL current. Thus, one can control the trigger voltage by adjusting the charge in the floating gate 44 of the non-volatile memory 52 to meet the circuit requirement. As shown in FIG. 8, the charge in the floating gate 44 can be controlled by EEROM or flash programming methods in the art. The greater the number of electrons in the floating gate 44, the larger the GIDL current and the less the trigger voltage.

Figure 9:
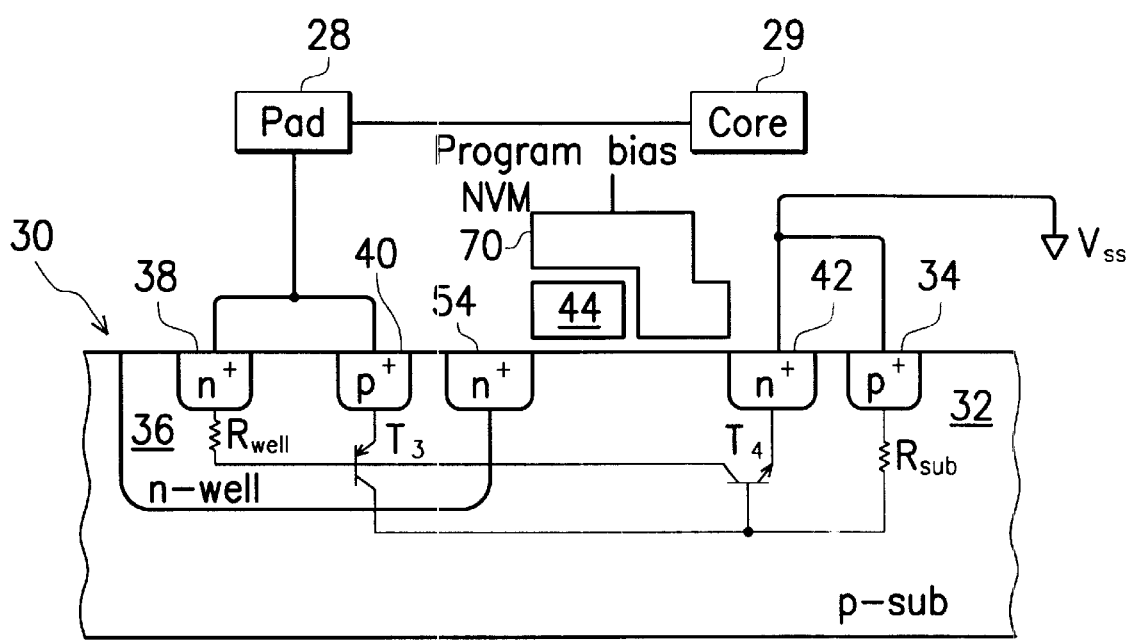
FIG. 9 is a cross-sectional diagram of the present invention with a split-gate memory.

Obviously, the embodiment of the present invention is not constrained on the stacked-gate memory as mentioned before. For example, a split-gate memory, as shown in FIG. 9, can also be employed in the present invention. To make the GIDL current trigger the SCR 50, the source/drain which is closest to the control gate 70 is coupled to the second node (the power source VSS). Another source/drain, which is far from the control gate 70, is positioned on the junction to generate the GIDL current.

After structuring the ESD protection circuit of the present invention, one can program the non-volatile memory 52 to store predetermined charges: into the floating gate during succeeding manufacturing steps, such as wafer sorting and final testing, to define the trigger voltage of the SCR for each I/O port. For example, the non-volatile memory of the ESD protection circuit in a 5-volt I/O can be defined and programmed to make the trigger voltage of the SCR have a value around 10 volt. The non-volatile memory of the ESD protection circuit in a 12-volt I/O can be defined and programmed to make the trigger voltage around 18 volt. No more layout drawing and wafer experiment is needed. That means the present invention reduces cost.

In comparison with the ESD protection circuit in the prior art, the only requirement for changing the trigger voltage according to the present invention is to adjust the quantity of the charge in the floating gate. This means that the ESD protection circuit of the present invention has a broader utility than that. in the prior art and reduces the cost and time for developing different ESD protection circuits to meet different requirements.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electrostatic discharge protection circuit, comprising:
   a semiconductor-controlled-rectifier (SCR) comprising an anode, an anode gate and a cathode, the anode and the cathode being coupled to a first node and a second node, respectively; and
   a non-volatile memory comprising a floating gate and two source/drains, the two source/drains respectively being coupled to the cathode and the anode gate, the floating gate having a predetermined charge generated by a controllable bias voltage to decrease the trigger voltage of the SCR.

2. The electrostatic discharge protection circuit of claim 1, wherein the non-volatile memory is a split-gate memory.

3. The electrostatic discharge protection circuit of claim 2, wherein the source/drain closest to the control gate of the split-gate memory is coupled to the second node.

4. The electrostatic discharge protection circuit of claim 1, wherein the non-volatile memory is a stacked-gate memory.

5. The electrostatic discharge protection circuit of claim 1, wherein the first node is coupled to a pad of an integrated circuit.

6. An electrostatic discharge protection circuit, comprising:
   an n-type semiconductor layer comprising a first contact region coupled to a first node;
   a p-type semiconductor layer, comprising a second contact region, adjacent to the n-type semiconductor and forming a junction therebetween;
   a p-type doped region positioned in the n type semiconductor region and coupled to the first node, and a non-volatile memory positioned in the p-type semiconductor layer comprising a floating gate and two source/drains, one source/drain being coupled to the n-type semiconductor layer, the other source/drain and the second contact region both being coupled to a second node, wherein the floating gate is provided with a predetermined charge generated by a controllable bias voltage to increase the leakage current in one of the two drain/sources during an ESD event.

7. The electrostatic discharge protection circuit of claim 6, wherein the non-volatile memory comprises a substrate made of the p-type semiconductor layer.

8. The electrostatic discharge protection circuit of claim 6, wherein the non-volatile memory is a split-gate memory.

9. The electrostatic discharge protection circuit of claim 8, wherein the source/drain closest to the control gate of the split gate memory is coupled to the second node.

10. The electrostatic discharge protection circuit of claim 6, wherein the non-volatile memory is a stacked-gate memory.

11. The electrostatic discharge protection circuit of claim 6, wherein the first node is coupled to a pad of an integrated circuit.

\* \* \* \* \*